(12) United States Patent
Huang (10) Patent No.: US 8,169,211 B2
(45) Date of Patent: May 1, 2012

(54) METHOD FOR VERIFYING THE BANDWIDTH AND PHASE OF A DIGITAL POWER CONTROL SYSTEM

(75) Inventor: Ming-hsi Huang, Taichung (TW)

(73) Assignee: Chyng Hong Electronic Co., Taichung (TW)

( * ) Notice: Subject to any disclaimer, the term of this patent is extended or adjusted under 35 U.S.C. 154(b) by 492 days.

(21) Appl. No.: 12/552,382

(22) Filed: Sep. 2, 2009

(65) Prior Publication Data

US 2011/0050206 A1    Mar. 3, 2011

(51) Int. Cl.
*G01R 25/00* (2006.01)
(52) U.S. Cl. ................................ 324/76.77
(58) Field of Classification Search .......... None
See application file for complete search history.

(56) References Cited

U.S. PATENT DOCUMENTS

| 4,608,647 | A | * | 8/1986 | White et al. | 324/76.21 |
| 4,807,146 | A | * | 2/1989 | Goodrich et al. | 324/76.47 |
| 7,180,439 | B1 | * | 2/2007 | Bakker | 341/155 |

* cited by examiner

*Primary Examiner* — Jermele M Hollington
(74) *Attorney, Agent, or Firm* — Ming Chow; Sinorica, LLC (57) ABSTRACT

A method for verifying the bandwidth and phase of a digital power control system according to the present invention includes steps of: A. Disturbance Order Reading in which an A/D conversion unit receives an analog signal order and mix it with existing command components in a digital system unit; B. Phase Delay Compensation in which a phase lead compensator is designed that is based on the different sampling frequencies and time delay parameters of the digital system unit, and the phase lead compensator is added to the digital system unit; and C. System Measuring in which a mixed wave calculation unit and a supply unit are added to the digital system unit to make the analog command signal pass through the digital system unit and the mixed wave calculation unit to the supply unit and to further drive a power circuit.

9 Claims, 7 Drawing Sheets

METHOD FOR VERIFYING THE BANDWIDTH AND PHASE OF A DIGITAL POWER CONTROL SYSTEM

BACKGROUND OF THE INVENTION

1. Field of the Invention

This invention relates to a method for verifying the bandwidth and phase of a digital power control system.

2. Description of the Prior Art

Generally, the system bandwidth and its Bode diagram may be respectively measured and made in approximately three manners: a signal generator, a network analyzer, and a frequency response analyzer.

It is a strong point that no expensive instrument is required for measurement through the signal generator, but it is a weak point that when there is excessive noise, measurement error significantly increases and the measurement is more complicated, and when measured frequency points increase, the time is spent increasingly.

A band-pass filter is provided in the signal input terminal of network analyzer so that the measured frequency may follow the internal sinusoidal disturbance for assurance of signal accuracy.

The frequency response analyzer operates in two different modes, Fast Fourier Transform and Discrete Fourier Transform. The Fast Fourier Transform advantageously operates fast but is limited in sampling, which is generally available in high frequency analysis; on the other hand, although it takes much more time to test in the Discrete Fourier operation, the result obtained from detection is not easily interfered.

The common defects of measurement manners are the output distance and the predetermined readback signals that are analog, a digital power control system structured with a microprocessor or digital circuit cannot be used or used to accurately test to find out the frequency-response characteristics of a system. Owing to the limit to the sets of equipment, the design of control strategy is applied in the manners of try error and correction to set up a compensator without systematic design and verification. The design of compensator for a closed loop control system is an essential point for forming a digital power system or digital control system, so the method for measuring the frequency response must be improved for the basis of verification of compensator design.

Consequently, because of the technical defects of described above, the applicant keeps on carving unflaggingly through wholehearted experience and research to develop the present invention, which can effectively improve the defects described above.

SUMMARY OF THE INVENTION

A method for verifying the bandwidth and phase of a digital power control system according to the present invention comprising the steps of: A. Disturbance Order Reading in which an A/D conversion unit receives an analog signal order and mix it with existing command components in a digital system unit; B. Phase Delay Compensation in which a phase lead compensator is designed that is based on the different sampling frequencies and time delay parameters of the digital system unit, and the phase lead compensator is added to the digital system unit; and C. System Measuring in which a mixed wave calculation unit and a supply unit are added to the digital system unit to make the analog command signal pass through the digital system unit and the mixed wave calculation unit to the supply unit and to further drive a power circuit, and the power circuit feedbacks a signal to the digital system unit and, after the mixed wave calculation unit deducts the existing command components, sends it to the phase lead compensator to compensate, and then generates an analog output signal. Thus, the digital system unit may be used for the interface of a Bode diagram of given by the frequency response analyzer for achievement of easy, direct measurement.

Further, the digital system unit may be used for the interface of a Bode diagram of given by the frequency response analyzer for achievement of easy, direct measurement, and the phase lead compensator is used to compensate the phase for obtaining accurate system data.

DETAILED DESCRIPTION OF THE PREFERRED EMBODIMENTS

Now, the present invention will be described more specifically with reference to the following embodiments. It is to be noted that the following descriptions of preferred embodiments of the present invention are presented herein for purpose of illustration and description only; it is not intended to be exhaustive or to be limited to the precise form disclosed.

Figure 1:
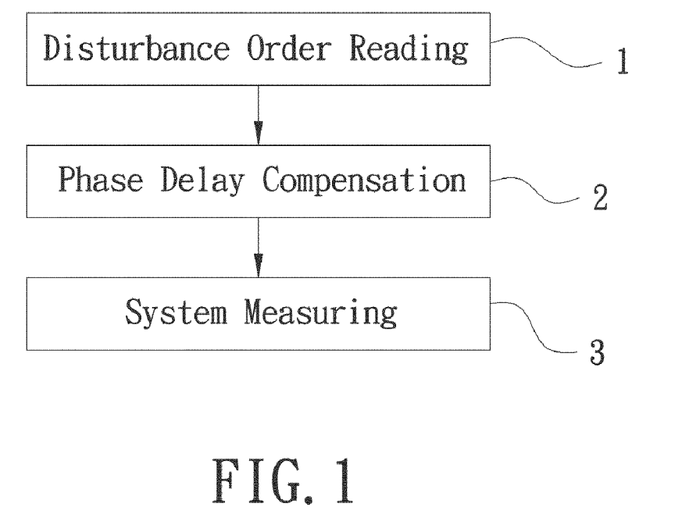
FIG. 1 is a flow block diagram of the present invention.
Figure 2:
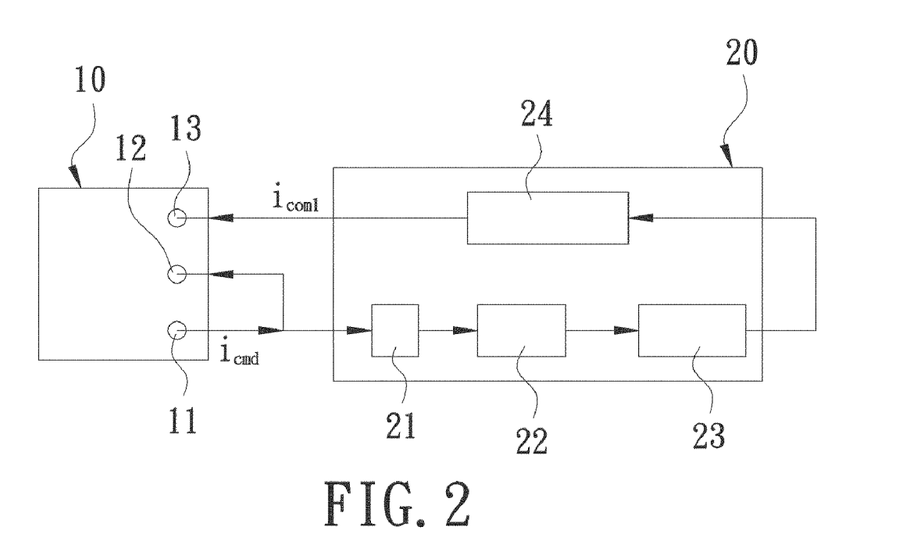
FIG. 2 is a circuit block diagram illustrating a Disturbance Order Reading step according to the present invention.

Firstly, with reference to FIG. 1 illustrating a flow block diagram of a preferred embodiment according to the present invention and with reference to FIG. 2 illustrating a circuit block diagram showing a Disturbance Order Reading step of a preferred embodiment of the present invention, the flow in the preferred embodiment of the present invention mainly comprises steps of Disturbance Order Reading step, Phase Delay Compensation, and System Measuring.

A. Disturbance Order Reading (1)

In the Disturbance Order Reading step (1), a frequency response analyzer (FRA) 10 and a digital system unit 20 are used. The frequency response analyzer 10 is provided with a disturbance command output terminal 11 and, a first signal terminal 12 and a second signal terminal 13 that are connected to the disturbance command output terminal. The frequency response analyzer 10 may generate an analog signal command $i_{cmd}$ through the disturbance command output terminal 11, and the analog command signal $i_{cmd}$ interfuse separately in the digital system unit 20 and the first signal terminal 12. Besides, the digital system unit 20 comprises an analog/digital conversion unit 21, a signal controller 22, a serial peripheral interface 23, and a D/A converter 24. The disturbance command output terminal 11 of frequency response analyzer 10 is connected to the analog/digital conversion unit 21, then the analog/digital conversion unit 21 is connected to the signal controller 22, and next the signal controller 22 is connected to the serial peripheral interface 23. Further, the serial peripheral interface 23 is connected to the digital/analog converter 24. Next, the digital/analog converter 24 is connected to a second signal terminal 13 of the frequency response analyzer 10 so that the analog signal command $i_{cmd}$ in the analog mode may generate a comparison signal $i_{com1}$ through the analog/digital conversion unit 21, the signal controller 22, the serial peripheral interface 23, and the digital/analog converter 24 in sequence. The comparison signal $i_{com1}$ is inputted to the second signal terminal 13.

Figure 3:
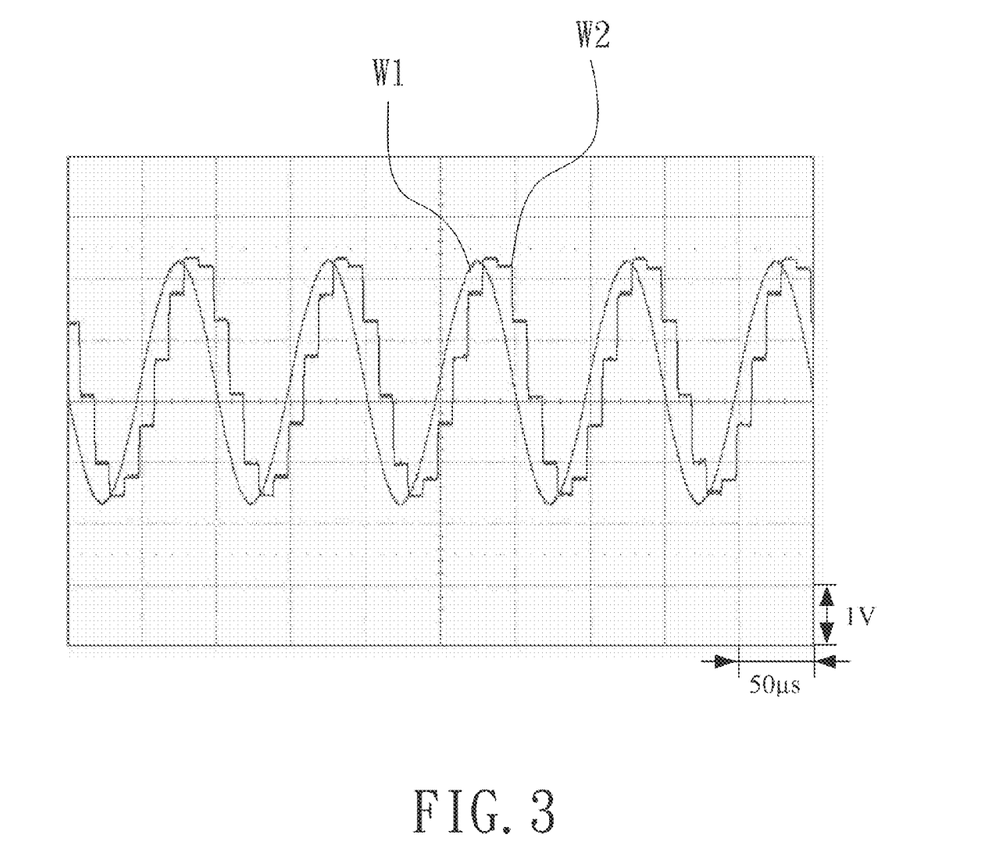
FIG. 3 shows a waveform of an analog command signal of FIG. 2 and a comparison signal.

With reference to FIG. 3 illustrating a waveform of an analog command signal of FIG. 2 and a comparison signal, when the frequency response analyzer 10 inputs a 10 KHz analog command signal $i_{cmd}$ and a sampling frequency 100 KHz obtained from the digital system unit 20, the analog command signal $i_{cmd}$ generates the comparison signal $i_{com1}$ through the digital system unit 20. The waveforms illustrating the analog command signal $i_{cmd}$ corresponding to the comparison signal $i_{com1}$ are respectively W1 and W2; it is apparent that the waveforms W1 and W2 are both in the condition of phase delay. The condition of phase delay may be analyzed to obtain a time delay parameter.

B. Phase Delay Compensation (2)

Figure 4:
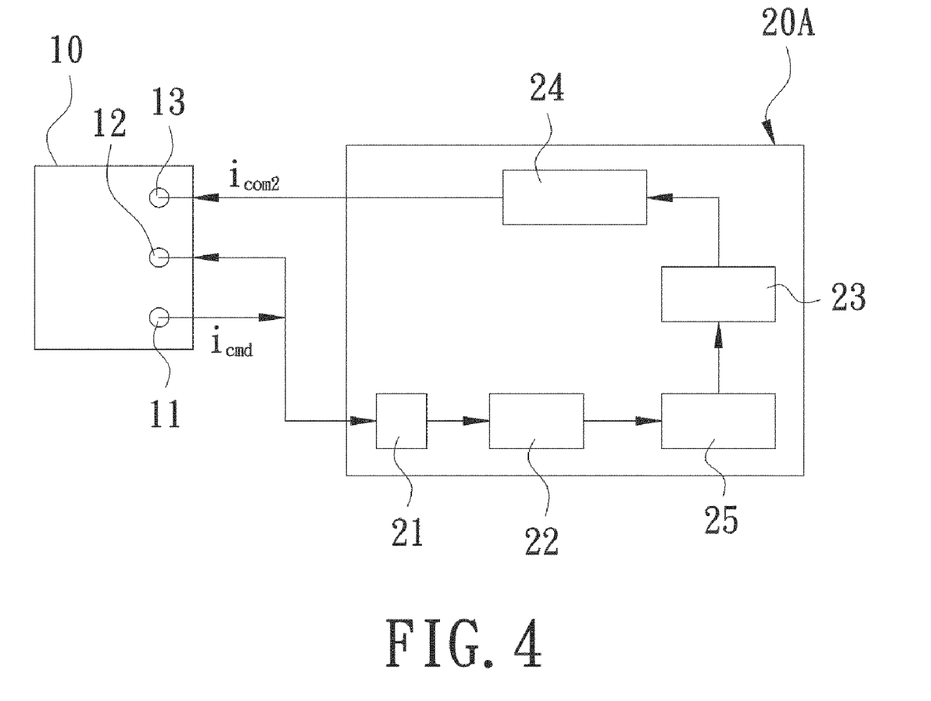
FIG. 4 is a circuit block diagram illustrating a Time Delay Compensation step according the present invention.

With cross reference to FIG. 4 that is a circuit block diagram illustrating a Time Delay Compensation step according the present invention, in the Phase Delay Compensation step (2), a phase lead compensator 25 is designed that is based on the different sampling frequencies obtained from the digital system unit 20, and on said time delay parameters, and the phase lead compensator 25 is added to the digital system unit 20, which further gives a digital system unit 20A. The phase lead compensator 25 is connected between the signal controller 22 and the serial peripheral interface 23 so as to compensate the time delay parameter caused by the condition of phase delay that happens when the digital system unit 20 samples.

Figure 5:
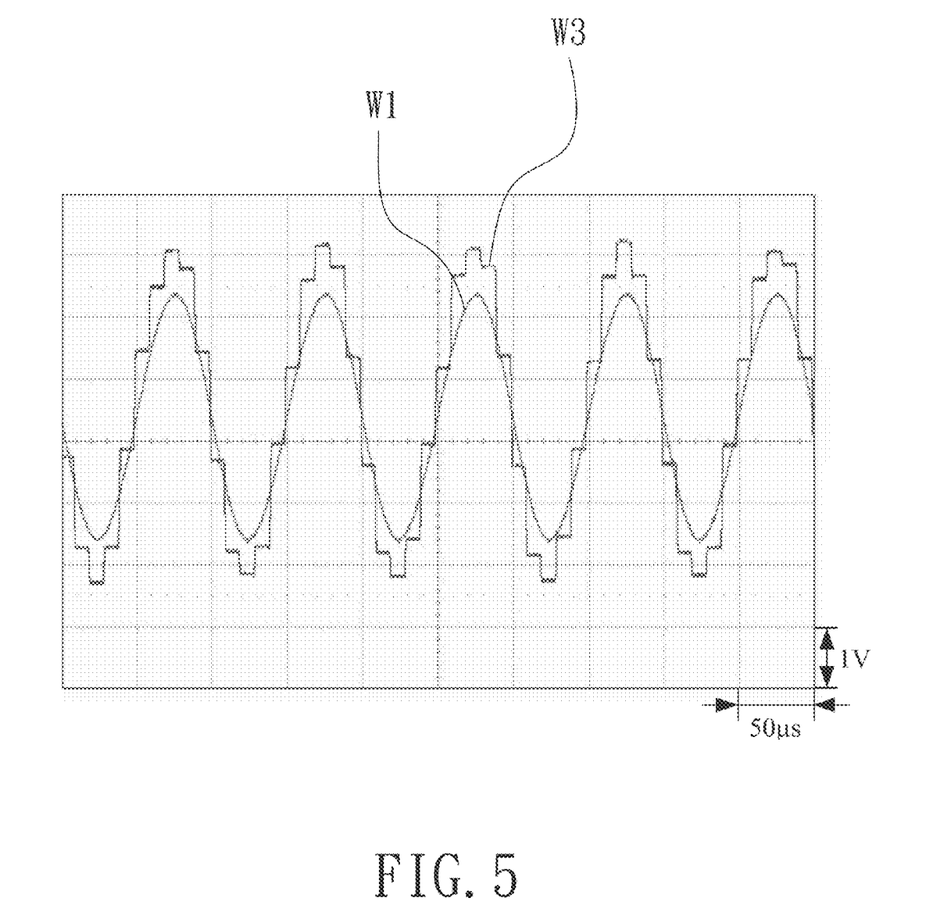
FIG. 5 shows a waveform of the compensated analog command signal and the comparison signal.

With reference to FIG. 5 illustrating a waveform of the compensated analog command signal and the comparison signal, when the frequency response analyzer 10 inputs a 10 KHz analog command signal $i_{cmd}$ and a sampling frequency 100 KHz obtained from the digital system unit 20, the analog command signal $i_{cmd}$ generates a comparison signal $i_{com2}$ through the digital system unit 20A of the phase lead compensator 25. The waveforms illustrating the analog command signal $i_{cmd}$ corresponding to the comparison signal $i_{com2}$ are respectively W1 and W3. It is apparent in the figure that the waveforms W1 and W3 are in phase after the phase compensation of phase lead compensator 25.

Figure 6:
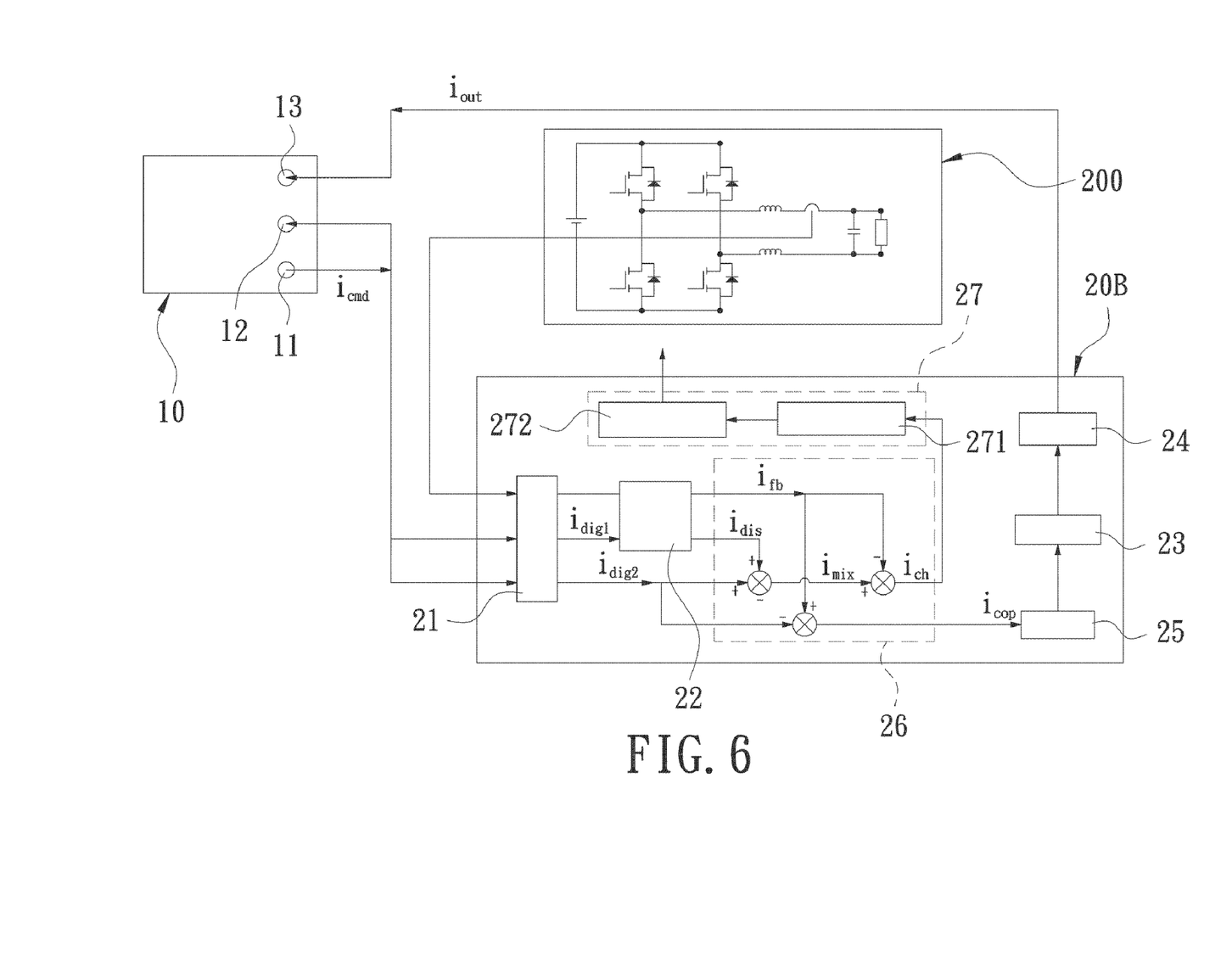
FIG. 6 is a circuit diagram illustrating a closed loop of a power circuit according to the present invention.

C. System Measuring (3):

With reference to FIG. 6 shown as a circuit diagram illustrating a closed loop of a power circuit according to the present invention, in the System Measuring step (3), a mixed wave calculation unit 26 and a supply unit 27 are added to the digital system unit 20A, a digital system unit 20B being further defined. The mixed wave calculation unit 26 is connected separately to the analog/digital conversion unit 21 and the signal controller 22 and may receive a signal converted by the analog/digital conversion unit 21 and the signal controller 22, and further mix and calculate the signal. The mixed wave calculation unit 26 is further connected to the supply unit 27 and the phase lead compensator 25. Next, the supply unit 27 comprises a compensator 271 and a pulse width modulation generator 272. One terminal of the compensator 271 is connected to the mixed wave calculation unit 26, while the other terminal of the compensator 271 is connected to the pulse width modulation generator 272. In the preferred embodiment of the present invention, the compensator 271 is a proportional integral compensator. Further, the pulse width modulation generator 272 may supply a signal to drive a power circuit 200. In the preferred embodiment of the present invention, the power circuit 200 is an output voltage modulation circuit formed with a power crystal. The power circuit 200 feedbacks a feedback signal $i_{fb}$ transmitted through the analog/digital conversion unit 21 and the signal controller 22. The feedback signal $i_{fb}$ is then mixed in the mixed wave calculation unit 26 for mixing and calculation and further transmitted to the phase lead compensator 25 for phase compensation, next the signal compensated by the phase lead compensator 25 is transmitted in sequence through the serial peripheral interface 23 and the digital/analog converter 24, and an analog output signal $i_{out}$ is generated and transmitted back to a second signal terminal 13 of the frequency response analyzer 10 for further comparison of and analysis on the signal.

With reference to FIG. 6, the disturbance command output terminal 11 of frequency response analyzer 10 generates the analog command signal $i_{cmd}$ and transmits it to the analog/digital converter 21 for conversion processing, thereby a first digital signal $i_{dig1}$ and a second digital signal $i_{dig2}$ being generated. The first digital signal $i_{dig1}$ is again mixed in the signal controller 22 for obtaining a disturbance signal $i_{dis}$, while the second digital signal $i_{dig2}$ is directly mixed in the mixed wave calculation unit 26 and added to the disturbance signal $i_{dis}$ for generating a mixed command $i_{mix}$. Further, the mixing command $i_{mix}$ is subtracted from the feedback signal $i_{fb}$ to obtain a variation signal $i_{ch}$. The variation signal $i_{ch}$ is mixed in the compensator 271 and thus may be further supplied to the pulse width modulation generator 272 so that the pulse width modulation generator 272 may supply a constant signal to drive the power circuit 200. The feedback signal $i_{fb}$ and the second digital signal $i_{dig2}$ are further mixed in the mixed wave calculation unit 26 and subtracted from each other to gain a compensation signal $i_{cop}$. The compensation signal $i_{cop}$ is transmitted through the phase lead compensator 25, the serial peripheral interface 23, and a digital/analog converter 24 in sequence and converted to gain the analog output signal $i_{out}$. The analog output signal $i_{out}$ is transmitted back to the second signal terminal 13 of frequency response analyzer 10. Thus, the digital system unit 20B may be used for the interface of a Bode diagram of given by the frequency response analyzer 10 for achievement of easy, direct measurement.

Figure 7:
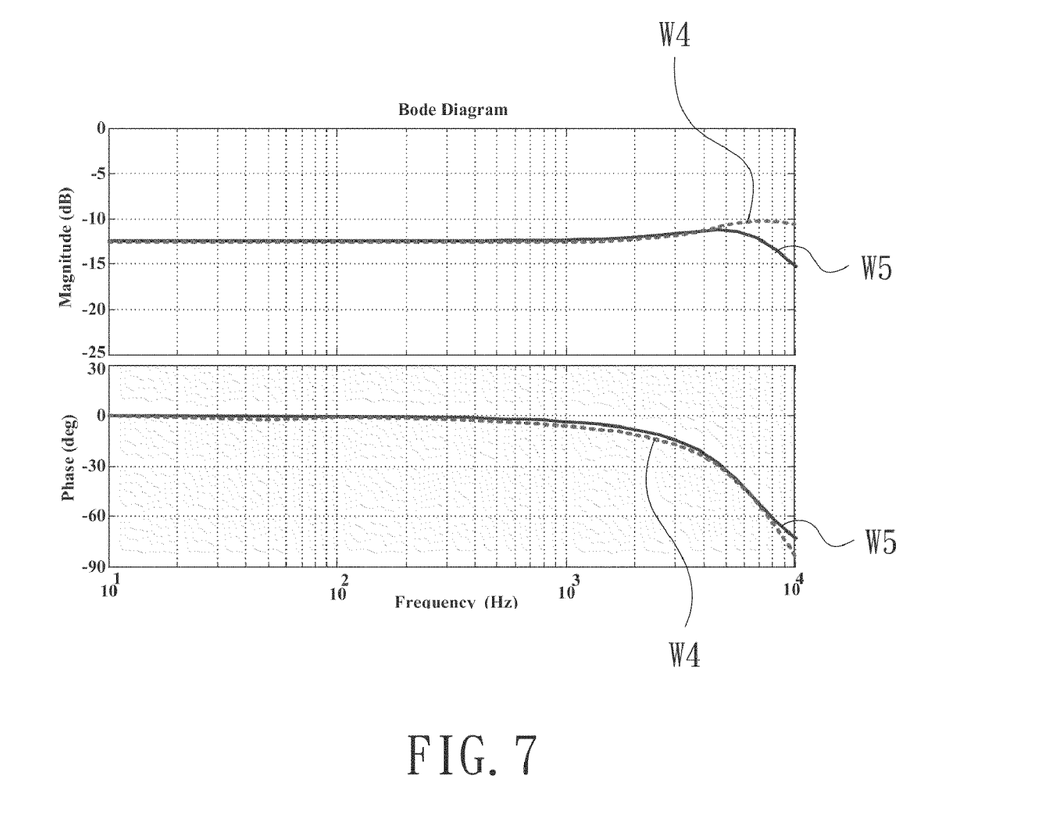
FIG. 7 is a Bode diagram illustrating the return time of a signal not specified that is shown in FIG. 6.
Figure 8:
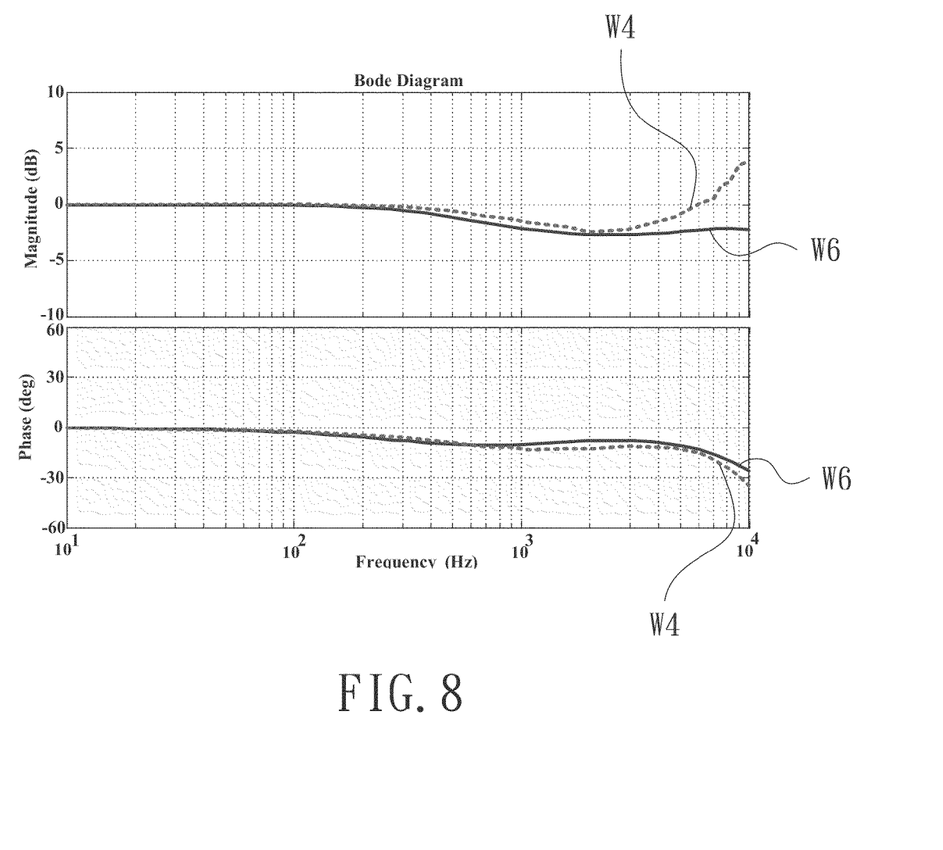
FIG. 8 is a Bode diagram illustrating the return time of a specified signal shown in FIG. 6.

Refer to FIGS. 7 and 8 shown respectively as a Bode diagram illustrating the return time of a signal not constant and that of a constant signal that are shown in FIG. 6, and as a Bode diagram given from the digital system unit 20B measured in the System Measuring step (3) through the digital power control system. With reference to FIG. 7, it is apparent that, after the compensation parameter is added to the digital system unit 20B in this method, the curve of waveform W4 for the digital system unit 20B measured by the frequency response analyzer 10 is approximate to the curve of waveform W5 obtained in a manner of simulation of an actual component parameter. However, in the aspect of high frequency of phase, there is still an error margin between the wave curve W4 obtained from the actual measurement, and the wave curve W5 obtained in the manner of simulation of the actual component parameter. Thus, in the preferred embodiment of the present invention, the time at which the signal from the analog/digital conversion unit 21 at the constant sampling frequency is transmitted back to the second signal terminal 13 is constant. With reference to FIG. 8, the phase error between the wave curve W4 given from actual measurement and the simulative wave curve W5 may be thereby compensated exactly for obtaining an exact actual measurement wave curve W6.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for verifying the bandwidth and phase of a digital power control system, comprising steps of:
   A. Disturbance Order Reading in which an analog command signal is supplied and interfused into a digital system unit, a comparison signal is generated and, after the analog command signal is compared with the comparison signal, a time delay parameter is obtained;
   B. Phase Delay Compensation in which a phase lead compensator is designed that is based on the different sampling frequencies and time delay parameters of the digital system unit, and the phase lead compensator is added to the digital system unit so as to compensate the phase delay caused due to the digital system unit; and
   C. System Measuring in which a mixed wave calculation unit and a supply unit are added to the digital system unit to make the analog command signal pass through the digital system unit and the mixed wave calculation unit to the supply unit and to further drive a power circuit, and the power circuit feedbacks a signal to the phase lead compensator through the digital system unit and the mixed wave calculation unit to compensate, and then generates an analog output signal so that the analog command signal and the analog output signal may be used for verifying the system bandwidth and phase.

2. The method for verifying the bandwidth and phase of the digital power control system according to claim 1, wherein the analog command signal is an analog signal generated by a frequency response analyzer.

3. The method for verifying the bandwidth and phase of the digital power control system according to claim 1, wherein in the Disturbance Command Reading step, the digital system unit further comprises an analog/digital conversion unit, a signal controller, a serial peripheral interface, and a D/A converter, and the analog command signal generates a comparison signal through the analog/digital conversion unit, the signal controller, the serial peripheral interface, and the digital/analog converter in sequence.

4. The method for verifying the bandwidth and phase of the digital power control system according to claim 3, wherein in the Phase Delay Compensation step, the phase lead compensator is connected between the signal controller and the serial peripheral interface.

5. The method for verifying the bandwidth and phase of the digital power control system according to claim 3, wherein in the System Measuring step, the mixed wave calculation unit receives a signal converted by the analog/digital conversion unit and the signal controller and interfuses it separately into the supply unit and the phase lead compensator.

6. The method for verifying the bandwidth and phase of the digital power control system according to claim 3, wherein the time of return of the signal from the analog/digital conversion unit is constant.

7. The method for verifying the bandwidth and phase of the digital power control system according to claim 1, wherein the supply unit further comprises a compensator and a pulse width modulation generator, one terminal of the compensator is connected to the mixed wave calculation unit, the other terminal is connected to the pulse width modulation generator so that the signal mixed by the mixed wave calculation unit may pass through the compensator and the pulse width modulation generator in sequence, and a signal is supplied to drive the power circuit.

8. The method for verifying the bandwidth and phase of the digital power control system according to claim 7, wherein the compensator is a PI compensator.

9. The method for verifying the bandwidth and phase of the digital power control system according to claim 1, wherein the power circuit is an output voltage modulation circuit formed with a power crystal.

* * * * *